United States Patent [19]

Agoston et al.

[11] Patent Number: 4,758,736
[45] Date of Patent: Jul. 19, 1988

[54] FAST TRANSITION, FLAT PULSE GENERATOR

[75] Inventors: Agoston Agoston, Beaverton; John E. Carlson, Portland, both of Oreg.

[73] Assignee: Tektronix, Inc., Beaverton, Oreg.

[21] Appl. No.: 845,289

[22] Filed: Mar. 28, 1986

[51] Int. Cl.[4] .......................... H03K 5/01; H03K 3/26
[52] U.S. Cl. ..................................... 307/268; 307/243; 307/259; 307/317 A
[58] Field of Search ............... 307/260, 268, 263, 265, 307/317 A, 228, 227, 259, 503, 243, 257, 561, 565; 328/27, 59, 61, 186, 185, 14

[56] References Cited

U.S. PATENT DOCUMENTS

| | | | |
|---|---|---|---|
| 2,858,434 | 10/1958 | Tollefson | 328/186 |
| 2,924,711 | 2/1960 | Kretzmer | 307/317 |
| 3,215,860 | 11/1965 | Neumann | 328/186 |
| 3,351,863 | 11/1967 | Riemens | 307/317 |
| 3,356,956 | 12/1967 | Willard | 328/186 |
| 4,060,739 | 11/1977 | Russer et al. | 307/243 |

*Primary Examiner*—Stanley D. Miller
*Assistant Examiner*—Timothy P. Callahan
*Attorney, Agent, or Firm*—John P. Dellett; Daniel J. Bedell

[57] ABSTRACT

A pulse generator utilizes a pair of current sources acting through a pair of Schottky diode switches to provide load currents in opposite directions through a load resistor to produce an output voltage across the load resistor of magnitude proportional to the difference between the load current magnitudes. The pulse generator output voltage is abruptly driven to zero potential by applying balanced, rapid slewing voltage pulses to the Schottky diode switches, causing the switches to simultaneously divert the load currents from the load resistor. The balanced voltage pulses are developed at the terminals of a step-recovery diode by switching the step-recovery diode from forward to reverse bias state.

11 Claims, 1 Drawing Sheet

4,758,736

FAST TRANSITION, FLAT PULSE GENERATOR

BACKGROUND OF THE INVENTION

The present invention relates in general to pulse generators utilizing diode switches to switch load currents through a load resistor to produce a stepped output voltage.

The bandwidth of an amplifier (or any other electronic device) can be determined by measuring the output of the amplifier in response to a range of input signal frequencies but such a method can be time consuming. Fortunately the bandwidth of an amplifier can be more quickly determined by observing its response to a square wave signal since the rise time of the amplifier output voltage in response to an abrupt transition in an input voltage is inversely proportional to the amplifier bandwidth. The accuracy of the measurement depends on the abruptness of the input voltage transition provided by the square wave signal and also on the flatness of the square wave signal before and after the transition.

One method of producing a relatively fast voltage transition utilizes a Schottky diode switch to divert a constant current away from a load resistor. As illustrated in FIG. 1, the diode switch comprises a pair of Schottky diodes Da and Db having cathodes connected to a current source Is. The anode of diode Db is connected to ground through a load resistor $R_o$ while the anode of diode Da is connected to a negative voltage $-V$ through another resistor R and to a source of positive voltage $+V$ through a high speed switch S. When switch S is open, the $-V$ source forward biases diode Db and reverse biases diode Da such that current Is is drawn through resistor $R_o$ to produce a negative output voltage Vo. When switch S is closed, voltage source $+V$ forward biases diode Da and reverse biases diode Db so that current Is is supplied from $+V$ through diode switch S and diode Da rather than from ground through resistor $R_o$ and diode Db. As the rise time of the leading edge of the pulse applied to diode Da produced by closing switch S is decreased, the transition of Vo from a positive voltage to a zero voltage becomes more abrupt. However diodes Da and Db include inherent capacitances which differentiate the square wave pulse from switch S1 to produce a small current which is fed through diodes Da and Db to the load resistor $R_o$ and this current causes the output voltage Vo to ring following a transition. As the rise time of the leading edge of the pulse applied to Da is increased, the amount of ringing in Vo after Vo switches state is also increased. Thus the switching speed of this circuit is limited by the amount of ringing that can be tolerated in Vo following a state transition.

What is needed is a pulse generator for producing an abrupt state transition in an output voltage wherein the output voltage is flat following the state transition.

SUMMARY OF THE INVENTION

In accordance with one aspect of the invention, a pulse generator utilizes a pair of current sources acting through a pair of Schottky diode switches to provide load currents of opposite polarity through a load resistor. The load currents produce an output voltage across the load resistor of magnitude proportional to the difference between the load current magnitudes. The pulse generator output voltage is abruptly driven to zero potential by applying balanced, rapid slewing voltage pulses of opposite polarity to the Schottky diode switches, causing the switches to simultaneously divert the load currents from the load resistor. Since the voltage pulses are balanced and of opposite polarity, any ringing disturbance to the zero potential of the output voltage following an output voltage transition resulting from currents fed through one diode switch to the load resistor is matched by an equal and opposite disturbance resulting from currents of opposite polarity fed through the other diode switch. Therefore the output voltage remains flat following transition to zero potential.

In accordance with another aspect of the invention, the magnitude of the current provided by each current source is adjustable. Since the magnitude of the output voltage produced by the pulse generator is proportional to the difference between the two opposite polarity currents, the output voltage of the pulse generator prior to transition to zero potential can be adjusted over a range of positive and negative values so that the transition to zero potential may be selectively either a rising or falling edge.

In accordance with a further aspect of the invention, the balanced, rapid slewing voltage pulses are developed at the terminals of a step-recovery diode by switching the step-recovery diode from forward to reverse bias state. The step-recovery diode switches rapidly to a reverse bias state so that the balanced voltage pulses have abrupt edges causing the diode switches to abruptly terminate the output voltage with a rise time on the order of a few picoseconds.

It is accordingly an object of the invention to provide a new and improved pulse generator which provides a voltage pulse having an abrupt transition to zero potential from selectively either positive or negative potentials.

It is another object of the invention to provide a new and improved pulse generator which eliminates ringing in its output voltage following transition zero potential.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is a schematic diagram of a pulse generator according to the prior art; and FIG. 2 is a schematic diagram of a pulse generator according to the present invention.

DETAILED DESCRIPTION

Figure 1:
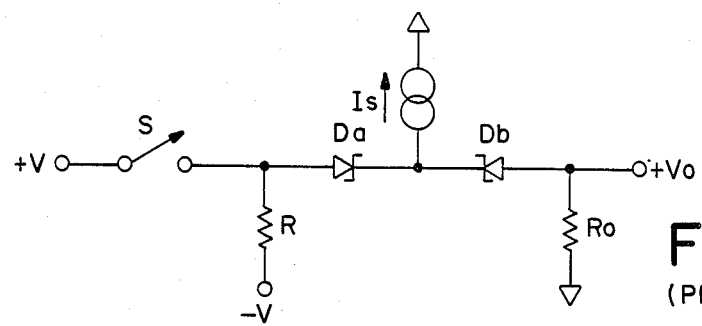
Figure 2:
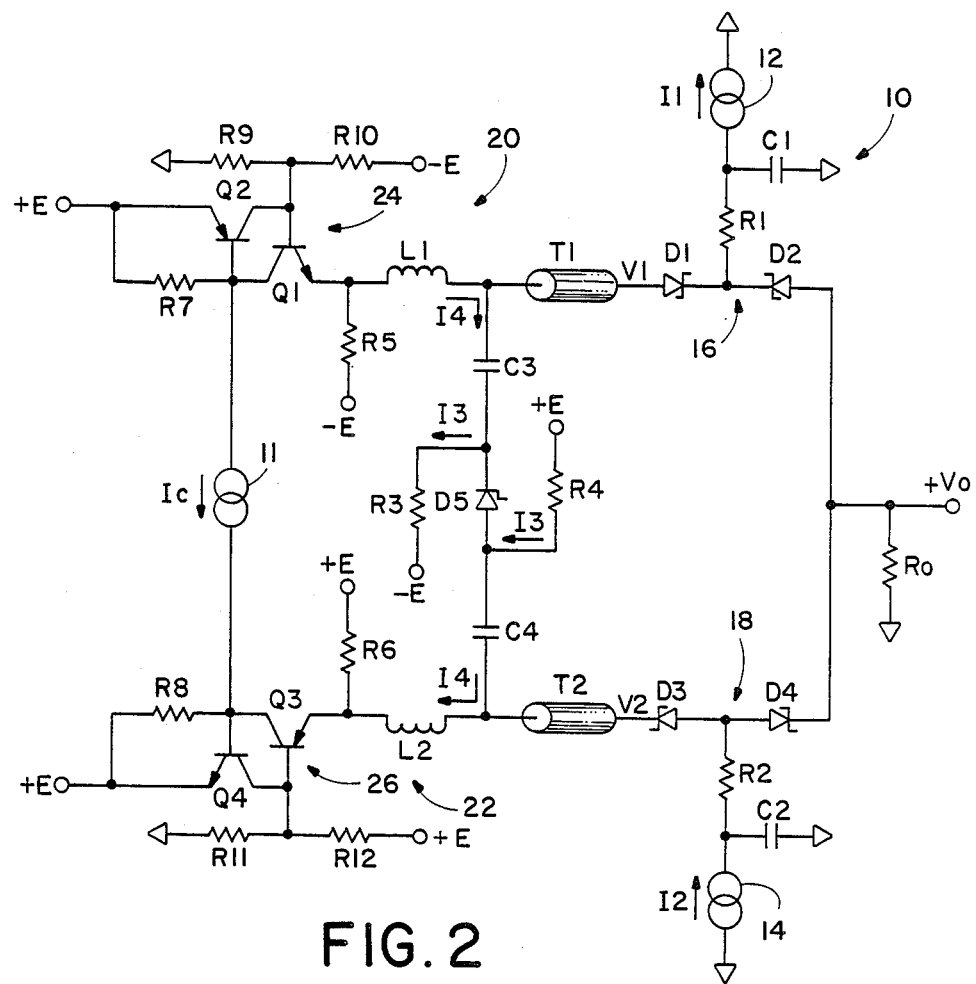

Referring to FIG. 2, there is depicted in schematic diagram form a pulse generator 10 according to the present invention adapted to produce an output voltage Vo of adjustable magnitude and polarity across a load resistor $R_o$ and to abruptly drive the output voltage to zero potential after a control current Ic produced by a current source 11 is applied to the pulse generator. When current source 11 is turned off, the output voltage Vo is produced in response to two currents I1 and I2 transmitted in opposite directions through the load resistor $R_o$ from current sources 12 and 14 respectively. Thus the magnitude of Vo is proportional to the difference in magnitudes between I1 and I2 and Vo may be either positive or negative with respect to ground potential, depending on whether I2 is larger than or less than I1.

The load resistor $R_o$ is grounded at one end while its other end is connected to the anode of a Schottky diode D2 and a cathode of another Schottky diode D4. A resistor R1 connects the cathode of diode D2 to current source 12 while a resistor R2 connects the anode of diode D4 to current source 14. When diodes D2 and D4 are forward biased, current source 12 draws current I1 from ground through the load resistor $R_o$, diode D2, and resistor R1 while current source 14 transmits current I2 to ground through the series connected resistor R2, diode D4 and load resistor $R_o$. The magnitude of Vo is proportional to the difference between I1 and I2 and the magnitudes of I1 and I2 are adjustable. Vo will be positive with respect to ground if the magnitude of I2 exceeds the magnitude of I1 and negative if the magnitude of I1 exceeds the magnitude of I2.

The cathode of diode D2 is also attached to the cathode of another Schottky diode D1. Diodes D1 and D2 form a diode switch 16 which can supply current I1 to current source 12 either from ground through the load resistor $R_o$ and diode D2 or from another source via diode D1, depending on which diode is forward biased. The anode of diode D4 is also connected to the anode of another Schottky diode D3 to form another diode switch 18 which can either transmit current I2 from current source 14 to the load resistor $R_o$ via diode D4 or divert current I2 away from the load resistor via diode D3, depending on which diode is forward biased.

When currents I1 and I2 are to be transmitted through the load resistor $R_o$, a voltage V1 at the anode of diode D1 is driven low in order to forward bias diode D2 and to reverse bias diode D1, while a voltage V2 at the cathode of diode D3 is driven high in order to forward bias diode D4 and reverse bias diode D3. Conversely, when currents I1 and I2 are to be diverted away from load resistor $R_o$ in order to drive Vo to zero potential, voltage V1 is driven high and voltage V2 is driven low so that diodes D1 and D3 are forward biased and diodes D2 and D4 are reverse biased. Voltages V1 and V2 are balanced in that they are at all times of the same magnitude but of opposite polarity.

When voltage V1 changes from a low to a high potential, small inherent capacitances in diodes D1 and D2 differentiate the V1 voltage, thereby producing a small ringing current in response to the change in V1 and this current is supplied to load resistor $R_o$ through D1 and D2. At the same time, small inherent capacitances in diodes D3 and D4 produce another small ringing current in response to the change in voltage V2 and this other small current is also supplied to load resistor $R_o$ through D3 and D4. Since V1 and V2 are balanced and change in opposite phase relation to one another, the small ringing currents supplied to the load resistor as a result of changes in V1 and V2 will also be of equal magnitude but of opposite phase and will therefore cancel one another. Thus, the use of a pair of diode switches 16 and 18 controlled by balanced control voltages 16 and 18 to switch opposing load currents I1 and I2 away from load resistor $R_o$ permits the pulse generator 10 of the present invention to drive the output voltage Vo to a flat ground potential while eliminating any disturbance to the ground potential of Vo resulting from ringing currents fed through the diode switches 16 and 18.

Control voltages V1 and V2 are derived from the voltages appearing at the cathode and anode of a step-recovery diode D5. The cathode of diode D5 is connected to the anode of diode D1 through a capacitor C3 and a short transmission line T1, while the anode of diode D5 is connected to the cathode of diode D3 through a capacitor C4 and another transmission line T2. When diode D5 is forward biased, V1 is low and V2 is high. Diodes D1 and D3 are reverse biased, diodes D2 and D4 are forward biased, and currents I1 and I2 are transmitted through the load resistor $R_o$. When diode D5 is reverse biased, V1 is high and V2 is low. Diodes D1 and D3 are forward biased, diodes D2 and D4 are reverse biased, and currents I1 and I2 are diverted away from the load resistor. A step-recovery diode stores charge while conducting in the forward direction, and when the direction of the current through the diode is suddenly reversed, the diode conducts current in the reverse direction for a short time while the stored charge is removed. When the stored charge is removed, the step-recovery diode abruptly cuts off the reverse current and the reverse bias voltage across the diode rises rapidly, with a rise time on the order of 70-100 picoseconds.

The cathode of diode D5 is also connected to a negative voltage source $-E$ through a resistor R3 while the anode of diode D5 is connected to a positive voltage source $+E$ through another resistor R4. This arrangement produces a continuous current I3 passing from source $+E$ to source $-E$ through diode D5 in the forward direction so that diode D5 is normally forward biased. A balanced pair of switchable current sources 20 and 22 are adapted to provide a current I4 through diode D5 in the reverse direction. When I4 is off, diode D5 is forward biased by I3 so that V1 remains low and V2 remains high. When I4, which is larger than I3, is turned on, diode D5 conducts briefly in the reverse direction and then abruptly cuts off reverse current flow, rapidly driving V1 high and V2 low. The changes in V1 and V2 rapidly change the bias states of the diodes of diode switches 16 and 18 and as a result, the transition of output voltage Vo to ground potential is abrupt, with a transition time on the order of a few picoseconds.

Current source 20 includes an NPN transistor Q1 and a PNP transistor Q2 which form a "quasithyristor" switch 24 controlled by control current Ic applied to the base of Q2. A positive voltage source $+E$ is applied to the emitter of transistor Q2. The base of Q2 is coupled to a $+E$ source through a resistor R7 and to the collector of transistor Q1. The base of transistor Q1 is connected to ground through a resistor R9, to a negative voltage source $-E$ through a resistor R10, and to the collector of transistor Q2. A resistor R5 couples the emitter of transistor Q1 to a negative voltage source while an inductor L1 couples the transistor Q1 emitter to capacitor C3. The current I4 output of current source 20 is transmitted to capacitor C3 through inductor L1.

When Ic is off, the base of transistor Q2 is high and transistor Q2 is off. The base of transistor Q1 is held at a voltage determined by the divider R9, R10 so that transistor Q1 is conducting a constant current determined by R5. This current produces a voltage drop across resistor R7 which does not turn on Q2. In steady state, I4 is zero. The $-E$ volt source acting through resistor R5 pulls V1 down to reverse bias diode D1 and to forward bias diode D2 so that current I1 is supplied through resistor $R_o$.

When current Ic is turned on, the base of transistor Q2 is pulled low and transistor Q2 turns on. A positive-going voltage pulse appears at the emitter of transistor Q1 and this pulse is integrated by inductor L1 to produce current ramp I4 which is transmitted through capacitor C3 and through diode D5 in the reverse direction. The magnitude of current I4 by far exceeds the magnitude of current I3 and after its stored charge is removed, diode D5 abruptly switches off, driving voltage V1 high. With V1 high, diode D1 is forward biased and diode D2 is reverse biased. Current I1 is then supplied from Q1 via diode D1 rather than from ground via $R_o$ and diode D2.

Current source 22 is a "mirror image" of current source 20, and is adapted to draw current I4 through diode D5 when control current Ic is on and to draw no current through diode D5 when control current Ic is off. Current source 22 includes a PNP transistor Q3 and an NPN transistor Q4 which form another "quasi-thyristor" switch 26 controlled by control current Ic applied to the base of Q4. The negative voltage source $-E$ is applied to the emitter of transistor Q4. The base of Q4 is connected to the $-E$ source through a resistor R8 and to the collector of transistor Q3. The base of transistor Q3 is connected to ground through a resistor R11, to a positive voltage source $+E$ through a resistor R12, and to the collector of transistor Q4. A resistor R6 couples the emitter of transistor Q3 to a positive voltage source while an inductor L2 couples the transistor Q3 emitter to capacitor C4.

When Ic is off, the base of transistor Q4 is low and transistor Q4 is off. The base voltage of transistor Q3 is determined by the resistor divider R11, R12 so that Q3 is conducting a constant current determined by R6. This current produces a voltage drop across R8 but not high enough to turn on the transistor Q4. In steady state, the current I4 through inductor L2 is zero. The $+E$ voltage source acting through resistor R6 pulls V2 up to reverse bias diode D3 and to forward bias diode D4 so that current I2 is supplied to resistor $R_o$. When current Ic is turned on, the base of transistor Q4 is pulled up and transistor Q3 turns on. A negative-going voltage pulse appears at the emitter of transistor Q3 as it turns on and this pulse is integrated by inductor L2 to produce current ramp I4 which is drawn through capacitor C4 and through diode D5 in the reverse direction. When diode D5 switches to reverse bias state, voltage V2 is driven low to forward bias diode D3 and reverse bias diode D4. Current I2 is then transmitted through transistor Q3 via diode D3 rather than through load resistor $R_o$ via diode D4.

Transmission lines T1 and T2 are of matched impedance and length and the resistance of resistors R1 and R2 match the impedance of the transmission lines so that the transmission lines are terminated with their characteristic impedance. Thus control voltage pulses V1 and V2 are transmitted over transmission lines T1 and T2 and are forwarded to ground through capacitors C1 and C2 without reflections. Capacitors C3 and C4 are provided to block the DC biasing current I3.

The rise time of the voltages appearing at the emitters of transistors Q1 and Q3 is about 1 nanosecond, much slower than the rise time of control voltages V1 and V2 when the step-recovery diode D5 switches to reverse bias state. It is therefore important to ensure that V1 does not rise enough to forward bias diode D1 until diode D5 switches state. Therefore inductors L1 and L2 are sized to appropriately limit the voltage developed across the step-recovery diode D5 after transistors Q1 and Q3 switch on, while the diode D5 is still conducting in the reverse direction. This ensures that switches 16 and 18 do not change switching state until the step-recovery diode switches.

Thus the pulse generator of the present invention provides an output voltage pulse of adjustable magnitude and polarity having an abrupt transition to zero potential. The use of the pair of diode switches 16 and 18 controlled by balanced control voltages V1 and V2 to switch opposing load currents away from a load resistor $R_o$ permits the pulse generator 10 of the present invention to drive the output voltage Vo to a flat ground potential while eliminating any ringing in Vo following the transition due to ringing currents transmitted through inherent capacitances associated with diode switches 16 and 18. The use of the step-recovery diode D5 to control the switching of control voltages V1 and V2 ensures that the transition to ground potential of the output voltage Vo is very rapid.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. An apparatus for producing an output voltage step comprising:

means for producing a first current;

means for producing a second current, the first and second currents being of opposite polarities and unequal magnitudes;

means for generating first and second control signals wherein the first and second control signals are switched between first and second voltage states, the first and second voltage states being of equal magnitude but opposite polarity;

a load resistor;

first switch means responsive to the first control signal for directing the first current through the load resistor when the first control signal is of the first voltage state and for preventing the first current from passing through the load resistor when the first control signal is of the second voltage state; and second switch means responsive to the second control signal for directing the second current through the load resistor when the second control signal is of the second voltage state and for preventing the second current from passing through the load resistor when the second control signal is of the first voltage state, such that when the first control signal is of the first voltage state and the second control signal is of the second voltage state, the first and second currents are directed through the load resistor and an output voltage of magnitude proportional to the difference in magnitudes between the first and second currents is developed across the load resistor, and such that when the first control signal is of the second voltage state and the second control signal is of the first voltage state, the first and second currents are directed away from the load resistor and no output voltage is developed across the load resistor in response to the first and second currents.

2. An apparatus for producing an output voltage step comprising:
- means for producing a first current;
- means for producing a second current, the first and second currents being of opposite polarities and unequal magnitudes;
- means for generating first and second control signals wherein the first and second control signals are switched between first and second voltages states, the first and second voltage states being of equal magnitude but opposite polarity;
- a load resistor;
- first switch means responsive to the first control signal for directing the first current through the load resistor when the first control signal is of the first voltage state and for preventing the first current from passing though the load resistor when the first control signal is of the second voltage state; and
- second switch means responsive to the second control signal for directing the second current through the load resistor when the second control signal is of the second voltage state and for preventing the second current from passing through the load resistor when the second control signal is of the first voltage state,
- such that when the first control signal is of the first voltage state and the second control signal is of the second voltage state, the first and second currents are directed through the load resistor and an output voltage of magnitude proportional to the difference in magnitudes between the first and second currents is developed across the load resistor, and
- such that when the first control signal is of the second voltage state and the second control signal is of the first voltage state, the first and second currents are directed away from the load resistor and no output voltage is developed across the load resistor in response to the first and second currents,
- wherein said first switch means comprises:
- a first diode having an anode and a cathode; and
- a second diode having an anode and a cathode, the cathode of the second diode being connected to the cathode of the first diode, said first control signal being applied to the anode of the first diode, the anode of the second diode being connected to the load resistor, said first current being applied to the cathodes of said first and second diodes.

3. The apparatus according to claim 2 wherein said second switch means comprises:
- a third diode having an anode and a cathode; and
- a fourth diode having an anode and a cathode, the anode of the fourth diode being connected to the anode of the third diode, said second control signal being applied to the cathode of the third diode, the cathode of the fourth diode being connected to the load resistor, said second current being applied to the anodes of the third and fourth diodes.

4. The apparatus according to claim 3 wherein the first, second, third and fourth diodes comprise Schottky diodes.

5. The apparatus according to claim 3 wherein the means for generating first and second control signals comprise:
- a fifth diode having an anode and a cathode; and
- means supplying control current selectively in one of reverse and forward bias directions through said fifth diode for switching the fifth diode between forward and reverse bias states, the cathode of the fifth diode being coupled to the anode of the first diode and the anode of the fifth being coupled to the cathode of the third diode.

6. The apparatus according to claim 5 wherein the fifth diode comprises a step-recovery diode.

7. The apparatus according to claim 6 wherein the first, second, third and fourth diodes comprise Schottky diodes.

8. An apparatus for producing an output voltage step comprising:
- means for producing a first current;
- means for producing a second current, the first and second currents being of opposite polarities and unequal magnitudes;
- a load resistor;
- a first diode having an anode and a cathode;
- a second diode having an anode and a cathode, the cathode of the second diode being connected to the cathode of the first diode, the anode of the second diode being connected to the load resistor, said first current being applied to the cathodes of said first and second diodes;
- a third diode having an anode and a cathode;
- a fourth diode having an anode and a cathode, the anode of the fourth diode being connected to the anode of the third diode, the cathode of the fourth diode being connected to the load resistor, said second current being applied to the anodes of the third and fourth diodes;
- a fifth diode having an anode and a cathode, the cathode of the fifth diode being coupled to the anode of the first diode and the anode of the fifth being coupled to the cathode of the third diode; and
- means supplying control current selectively in one of reverse and forward bias directions through said fifth diode for switching the fifth diode between forward and reverse bias states,
- such that when the fifth diode is forward biased, the first and third diodes are reverse biased and the second and fourth diodes are forward biased, the second and fourth diodes thereby directing the first and second currents through the load resistor such that an output voltage of magnitude proportional to the difference in magnitudes between the first and second currents is developed across the load resistor, and
- such that when the fifth diode is reverse biased, the first and third diodes are forward biased and the second and fourth diodes are reverse biased, the first and third diodes thereby directing the first and second currents away from the load resistor such that no output voltage is developed across the load resistor in response to the first and second currents.

9. The apparatus according to claim 8 wherein said means supplying control current selectively in one of reverse and forward bias directions through said fifth diode for switching the fifth diode between forward and reverse bias states comprises:
- means for transmitting a constant third current through the fifth diode in a forward direction; and
- means for selectively transmitting a fourth current through the fifth diode in a reverse direction, said control current comprising the sum of said third and fourth currents.

10. The apparatus according to claim 9 wherein the fifth diode comprises a step-recovery diode.

11. The apparatus according to claim 10 wherein the first, second, third and fourth diodes comprise Schottky diodes.

* * * * *